(12) United States Patent
Chen et al.

(10) Patent No.: US 10,269,982 B2
(45) Date of Patent: Apr. 23, 2019

(54) METALLIC CHANNEL DEVICE AND MANUFACTURING METHOD THEREOF

(71) Applicants: TAIWAN SEMICONDUCTOR MANUFACTURING CO., LTD., Hsinchu (TW); National Taiwan University, Taipei (TW)

(72) Inventors: Miin-Jang Chen, Taipei (TW); Chi-Wen Liu, Hsinchu (TW); Po-Hsien Cheng, Taipei (TW)

(73) Assignees: TAIWAN SEMICONDUCTOR MANUFACTURING CO., LTD., Hsinchu (TW); NATIONAL TAIWAN UNIVERSITY, Taipei (TW)

( * ) Notice: Subject to any disclaimer, the term of this patent is extended or adjusted under 35 U.S.C. 154(b) by 0 days.

(21) Appl. No.: 15/205,799

(22) Filed: Jul. 8, 2016

(65) Prior Publication Data

US 2018/0013012 A1 Jan. 11, 2018

(51) Int. Cl.
*H01L 29/24* (2006.01)
*H01L 29/786* (2006.01)
*H01L 21/3205* (2006.01)
*H01L 29/66* (2006.01)
*H01L 29/78* (2006.01)

(52) U.S. Cl.
CPC .. *H01L 29/78696* (2013.01); *H01L 21/32051* (2013.01); *H01L 29/24* (2013.01); *H01L 29/66742* (2013.01); *H01L 29/66795* (2013.01); *H01L 29/66969* (2013.01); *H01L 29/7851* (2013.01); *H01L 29/7866* (2013.01); *H01L 29/78681* (2013.01)

(58) Field of Classification Search
CPC .................................. H01L 21/32051
See application file for complete search history.

(56) References Cited

U.S. PATENT DOCUMENTS 7,838,875 B1* 11/2010 Tsang ............... H01L 49/00
257/213
2017/0025514 A1* 1/2017 Wu ............... H01L 21/28079

OTHER PUBLICATIONS

Jesus Graciani et al., "Changing the physical and chemical properties of titanium oxynitrides TiN1-xOx by changing the composition", Physical Review B 80, 184112 (2009), 10 pgs.

* cited by examiner

*Primary Examiner* — Elias Ullah
(74) *Attorney, Agent, or Firm* — McDermott Will & Emery LLP

(57) ABSTRACT

In a method for manufacturing a metallic-channel device, a metallic layer is formed on a substrate. The metallic layer is formed by an atomic layer deposition technique and has a first thickness. An insulating layer is formed over the metallic layer. A gate contact layer is formed over the insulating layer. The formed layers are processed to remove the gate contact layer, the insulating layer, and a portion of the metallic layer from a source-drain region. A remaining portion of the metallic layer on the source-drain region has a second thickness that is smaller than the first thickness. Source and drain metal contacts are formed over the remaining portion of the metallic layer.

20 Claims, 7 Drawing Sheets

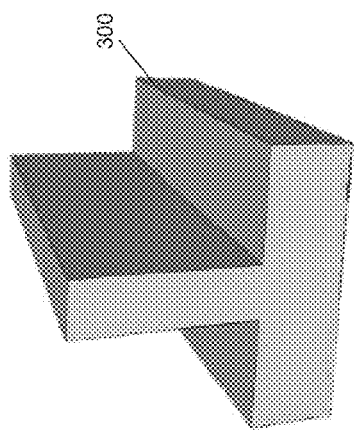
FIG. 3A
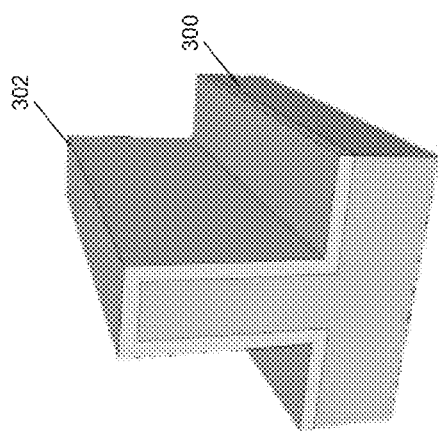
FIG. 3B
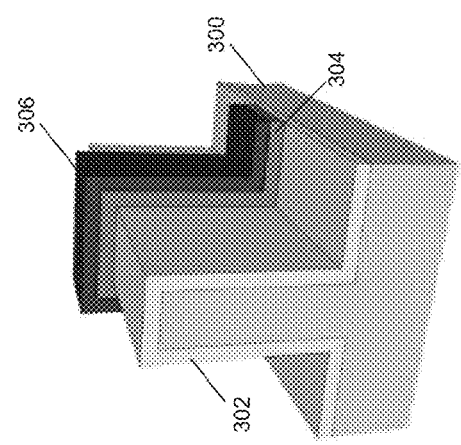
FIG. 3C
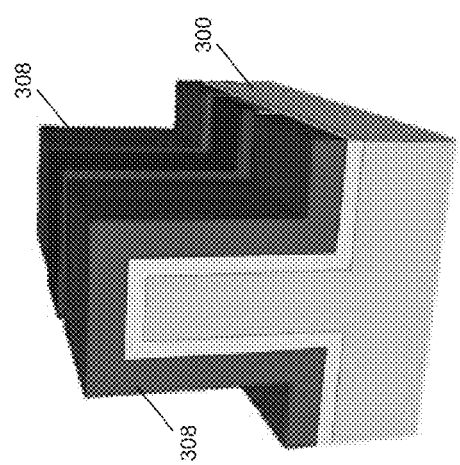
FIG. 3D
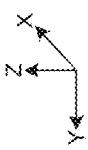

METALLIC CHANNEL DEVICE AND MANUFACTURING METHOD THEREOF

TECHNICAL FIELD

The disclosure relates to a semiconductor integrated circuit, and more particularly to a metallic-channel device prepared by the atomic layer deposition and doping techniques.

BACKGROUND

Metallic channel devices (e.g. transistors) use metallic channels that are the natural extension of highly-doped Si nanowire. Metallic junction-less field-effect transistors (FETs) benefit from a number of advantages including the reduction in the source and drain resistances, simple fabrication processes, and high values of transistor ON current. In a metallic junction-less FET device, a source-drain current can flow through the metallic channel, when the gate terminals are at zero bias voltage (e.g., ON state), and the source-drain current flow is stopped by biasing the gate terminal with a sufficiently negative voltage (e.g., OFF state). It is understood that the most desirable channel materials are expected to exhibit conductance close to that of a metal.

Due to high concentration of electrons in metals, penetration of electric filed in metals is prevented by the screening effect of the electrons. In order to observe field effect in metallic film, the thickness of the metallic film should be or the order of a screening length (e.g., about 2 nm). The electron concentration in a metal can be reduced to combat screening effect by precise doping of impurities into the metal. Doped metallic layers can be deposited by metal deposition techniques including sputtering and thermal evaporation. These techniques may not allow precise control the growth rate, film thickness, and composition at atomic scale.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A through 3D are exemplary three-dimensional (3-D) views showing various processes for manufacturing of a metallic-channel FinFET device according to one or more embodiments of the present disclosure.

DETAILED DESCRIPTION

It is to be understood that the following disclosure provides many different embodiments, or examples, for implementing different features of the invention. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

Figure 1:
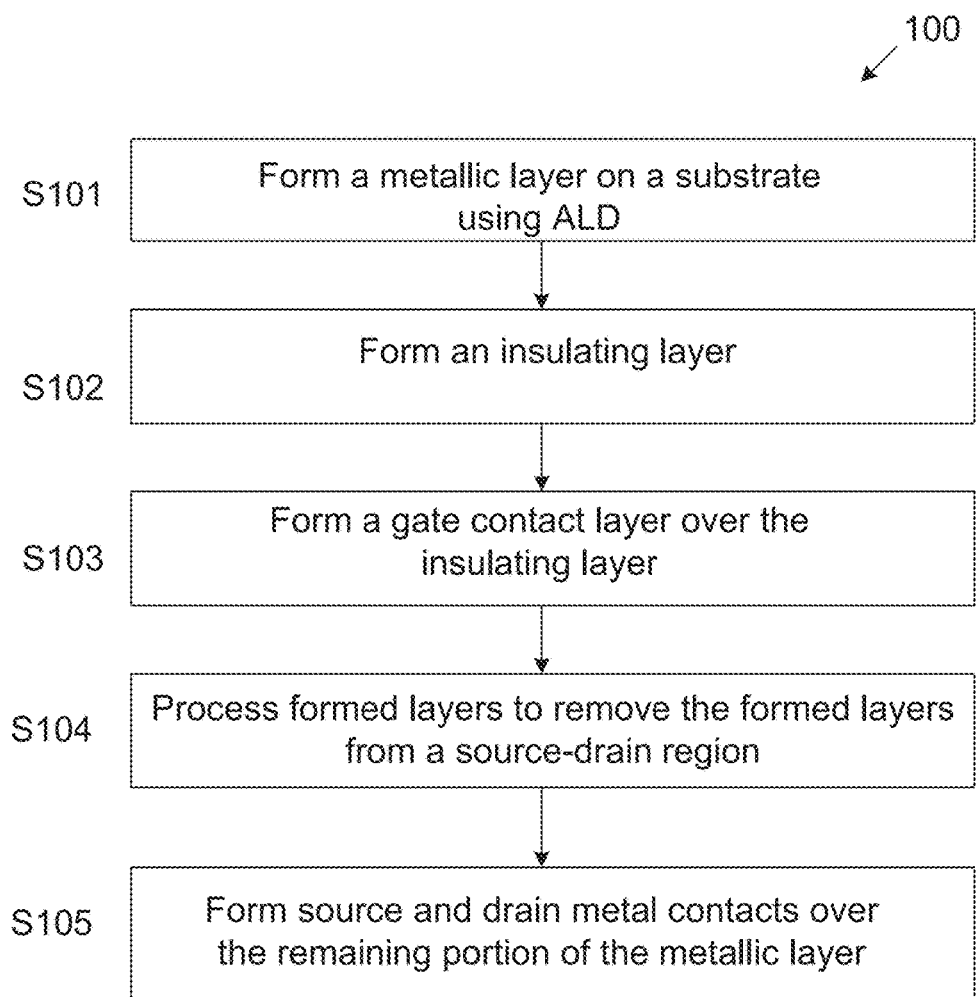
FIG. 1 is an exemplary process flow chart for manufacturing of a metallic-channel device according to one or more embodiments of the present disclosure.

FIG. 1 is an exemplary process flow chart 100 for manufacturing of a metallic-channel device according to one or more embodiments of the present disclosure. The flow chart 100 illustrates only a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable.

Figure 2A:
FIGS. 2A through 2F are exemplary cross-sectional views showing various processes for manufacturing of a metallic-channel metal-oxide-semiconductor field-effect transistor (MOSFET) device and a top-view of the MOSFET device according to one or more embodiments of the present disclosure.

In S101 of FIG. 1, a metallic layer 202, as shown in FIG. 2A, is formed on a substrate 200. In some embodiments, the substrate is selected from a list of materials appropriate the atomic layer deposition (ALD) of a metallic channel including, but not limited to, silicon-on insulator (SOI), germanium-on-insulator (GOI), intrinsic silicon (i-Si), intrinsic germanium (i-Ge), silicon germanium (SiGe), glass, and sapphire.

The metallic layer 202 is deposited using the ALD technique, as described in more details with respect to FIGS. 4A through 4G. The ALD technique is used to incorporate insulating materials such as titanium oxide ($TiO_2$) and aluminum nitride (AlN) into a conductive metallic material such as titanium nitride (TiN) to prepare titanium oxynitride ($TiN_{1-x}O_x$) and titanium aluminum nitride ($Ti_{1-x}Al_xN$) nanoscale ultra-thin films, respectively. The electron concentration in titanium nitride can be reduced by doping the oxygen (O) and aluminum (Al) impurities, so that the screening effect in metal can be greatly suppressed. In some embodiments, the electronic structure, such as bandgap, of titanium nitride is modulated by the quantum confinement effect in nanoscale ultrathin films prepared by atomic layer deposition (ALD) and the incorporation of materials with bandgap (e.g., $TiO_2$ and AlN) into titanium nitride. The choice of the bandgap material depends on the type of the transistors that are desired. For example, if a low-power transistor is desired, the bandgap is better to be blow 2 eV. For power devices, the larger the bandgap, the better is the performance of the device.

The ALD technique of the subject technology allows precise control of the growth rate, film thickness, and composition at atomic scale, which is not practical with other deposition techniques such as sputtering and thermal evaporation. Other advantageous features of the ALD process include reduction of the electron concentration by precise control of doping of the impurity such as oxygen (O) or aluminum (Al), precise and digital control of the thickness of the channel material to approach the screening length, and bandgap opening by quantum confinement effect in the nanoscale ultrathin films and incorporation of the materials with bandgap. In addition, the issue due to random dopant fluctuations in Si junction-less FETs can be prevented if titanium oxynitride ($TiN_{1-x}O_x$) or titanium aluminum nitride ($Ti_{1-x}Al_xN$) is used as the channel material, because of the high uniformity of the atomic layer doping process as a result of the self-limiting chemical reactions. For example, in ALD deposition, film thickness can be controlled precisely and digitally by the number of applied ALD cycles, within one monolayer precision; film composition can be controlled accurately with digital control; excellent step coverage and conformality (e.g., thickness error below 1 nm) can be achieved; and low defect density (e.g., about $10^{-12}$) can be provided without pinhole structures on large areas (e.g., up to 18 inch). Doped metallic layers can be deposited by metal deposition techniques including sputtering and thermal evaporation. These techniques, however, do not allow precise control the growth rate, film thickness, and composition at atomic scale.

In some embodiments, material for forming the metallic-channel, which the metallic layer 202 is for, is not limited to titanium nitride and other metals including tungsten nitride (WN), platinum (Pt), hafnium nitride (HfN), zirconium nitride (ZrN), or tantalum nitride (TaN) prepared by the atomic layer deposition technique can be used. The thickness of the metallic layer (e.g., a first thickness) is controlled to avoid screen effect and to induce quantum confinement effect. In one or more embodiments, the first thickness is less than about 20 nm.

In some embodiments, the metallic-channel comprises a doped metal compound including titanium oxynitride ($TiO_{1-y}N_y$), titanium aluminum nitride ($Ti_{1-x}Al_xN$), titanium silicon nitride ($Ti_{1-z}Si_zN$), hafnium oxynitride ($HfO_{1-y}N_y$), hafnium silicon nitride ($Hf_{1-z}Si_zN$), hafnium aluminum nitride ($Hf_{1-x}Al_xN$), zirconium oxynitride ($ZrO_{1-y}N_y$), zirconium silicon nitride ($Zr_{1-z}Si_zN$), zirconium aluminum nitride ($Zr_{1-x}Al_xN$), tantalum oxynitride ($TaO_{1-y}N_y$), tantalum aluminum nitride ($Ta_{1-x}Al_xN$), or tantalum silicon nitride ($Ta_{1-z}Si_zN$). In some embodiments, values of x, y, and z are between about 0.1 and about 1. In one or more embodiments, the doped metal compound is prepared by the ALD technique, and the doping is controlled to modify a bandgap of the channel material. In some embodiments, when the metallic-channel is a doped metal compound, the first thickness is controlled to be less than 30 nm to avoid screen effect and to induce quantum confinement effect in the metallic-channel. The screening effect is due to the high-concentration of electrons in metals that can shield an electric filed from penetrating the metal. The quantum confinement effect can be observed when the confinement size (e.g., a thickness of a material) of a particle such as electron is too small to be comparable to the wavelength of the electron. For example, when the size of the material thickness approaches nano scale, the decrease in confining dimension makes the energy levels of the electrons discrete, which results in widening up of a corresponding bandgap and ultimately increasing of the band gap energy of the material.

Figure 2B:
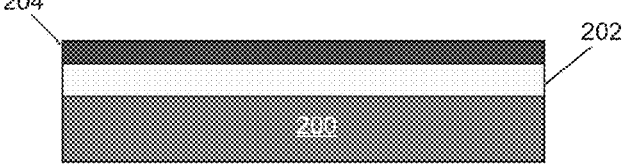

In S102 of FIG. 1 an insulating layer 204, as shown in FIG. 2B, is formed on the metallic layer 202. In some embodiments, the insulating layer 204 includes one or more layers of silicon oxide, silicon nitride, silicon oxy-nitride, or high-k dielectric materials. High-k dielectric materials comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the insulating layer 204 is in the range of about 1 nm to about 5 nm. In some embodiments, the insulating layer 204 includes an interfacial layer made of silicon dioxide. In some embodiments, the insulating layer 204 includes a single layer or a multilayer structure. In some embodiments, insulating layer 204 includes a ferroelectric negative capacitance material.

Figure 2C:
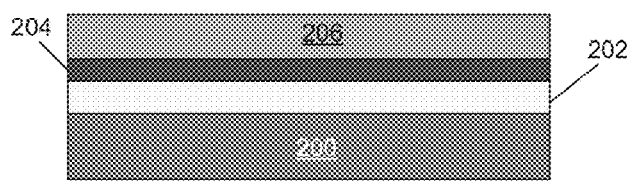

In S103 of FIG. 1, a gate contact layer 206, as shown in FIG. 2C, is formed on the insulating layer 204. In one embodiment, the gate contact layer 206 is doped polysilicon with uniform or non-uniform doping. In some embodiments, the gate contact layer 206 is a metal layer or a metal compound layer. In one or more embodiments, the gate contact layer 206 is a layer of tungsten nitride (WN), tungsten (W), titanium nitride (TiN), titanium (Ti), tantalum nitride (TaN), tantalum (Ta), Platinum (Pt) chromium (Cr), gold (Au), aluminum (Al), copper (Cu), nickel (Ni), other conductive materials with a work function compatible with the substrate material, or combinations thereof. In one or more embodiments, the gate contact layer 206 is formed using a suitable process such as ALD, chemical vapor deposition (CVD), plasma vapor deposition (PVD), plating, or combinations thereof. The width of the gate electrode layer 222 (in the X direction) is in the range of about 30 nm to about 60 nm in some embodiments.

Figure 2D:
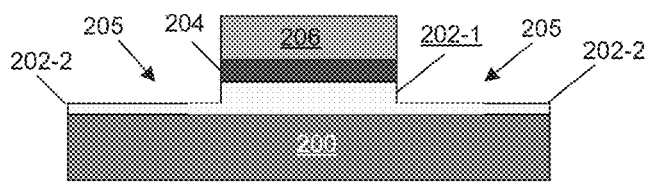

In S104 of FIG. 1, the formed layers, as shown in FIG. 2D, are processed to remove the formed layers from a source-drain region 205. The removal of the formed layers including the gate contact layer 206, the insulating layer 204, and a portion of the metallic layer 202 from a source-drain region 205 leaves a remaining portion 202-2 of the metallic layer on the source-drain region 205 having a second thickness smaller than the first thickness (e.g., thickness of layer 202-1). In one or more embodiments, the removal of the formed layers from the source-drain region 205 is performed, after defining the source-drain region 205 using patterning (lithography) and cleaning, by dry etching method and/or a wet etching method (e.g., using a dilute hydrofluoric (HF) solution).

Figure 2E:
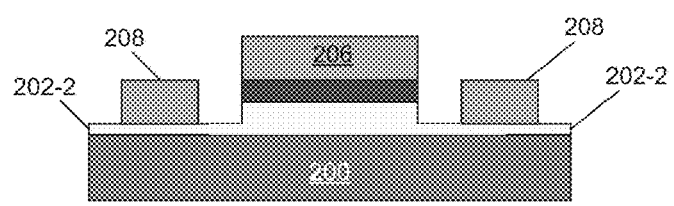
Figure 2F:
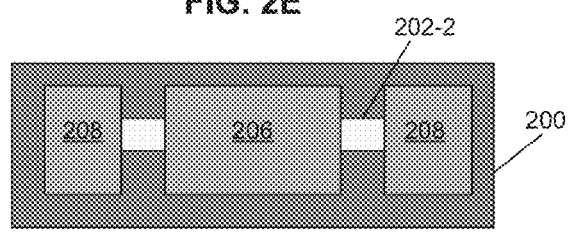

In S105 of FIG. 1, source and drain (SD) metal contacts 208, as shown in FIG. 2E, are formed over the remaining portion 202-2 of the metallic layer. In some embodiments, the SD metal contacts 208 are metal layers or metal compound layers. In one or more embodiments, the SD metal contacts 208 are layers of tungsten nitride (WN), tungsten (W), titanium nitride (TiN), titanium (Ti), tantalum nitride (TaN), tantalum (Ta), Platinum (Pt) chromium (Cr), gold (Au), aluminum (Al), copper (Cu), nickel (Ni), other conductive materials with work functions compatible with the substrate material, or combinations thereof. In one or more embodiments, the SD metal contacts 208 are formed using a suitable process such as ALD, chemical vapor deposition (CVD), plasma vapor deposition (PVD), plating, electron beam gun (EBG) evaporation, or combinations thereof. In some embodiments, the next step is a high temperature (e.g., about 300° C. to about 900° C.) annealing process to develop Ohmic contacts between the SD metal contacts 208 and the remaining portion 202-2 of the metallic layer. Subsequently, lithography is used to define the SD metal contacts 208 and etching (e.g., wet etch) is performed to remove the unnecessary SD metal from the regions around the defined SD metal contacts 208.

FIGS. 3A through 3D are exemplary three-dimensional (3-D) views showing various processes for manufacturing of a metallic-channel FinFET device according to one or more embodiments of the present disclosure. FIG. 3A shows a fin structure 300, over which other layers of the FinFET device are formed. In some embodiments, the fin structure 300 is made of a first semiconductor layer that is epitaxially grown over the substrate. The epitaxial layer may be doped by in-situ doping and/or ion implantation. In some embodiments, the fin structure 300 includes an intermediate semiconductor layer, also known as the bulk stressor (not shown in FIGS. 3A through 3D for simplicity), epitaxially grown over the surface of the first semiconductor layer, and a second semiconductor layer (not shown in FIGS. 3A through 3D for simplicity), is epitaxially grown over the intermediate semiconductor layer. In one or more embodiments, the first semiconductor layer is part of a substrate and is implanted with impurities. The substrate may be selected from a list of materials appropriate for the atomic layer deposition of a metallic channel including, but not limited to, silicon-on insulator (SOI), germanium-on-insulator (GOI), intrinsic silicon (i-Si), intrinsic germanium (i-Ge), silicon germanium (SiGe), glass, and sapphire.

The next step in preparing the metallic-channel FinFET device is to form a metallic layer 302 over the fin structure 300. The metallic layer 302 is deposited using the ALD technique. In some embodiments, material for forming the metallic-layer 302 is titanium nitride. In alternative embodiments, other metals including tungsten nitride (WN), platinum (Pt), hafnium nitride (HfN), zirconium nitride (ZrN), or tantalum nitride (TaN) prepared by the atomic layer deposition technique can be used. The thickness of the metallic layer 302 (first thickness) is controlled to avoid screen effect and to induce quantum confinement effect. In one or more embodiments, the first thickness is less than 20 nm.

In some embodiments, the metallic-layer 302 comprises a doped metal compound including titanium oxynitride ($TiO_{1-y}N_y$), titanium aluminum nitride ($Ti_{1-x}Al_xN$), titanium silicon nitride ($Ti_{1-z}Si_zN$), hafnium oxynitride ($HfO_{1-y}N_y$), hafnium silicon nitride ($Hf_{1-z}Si_zN$), hafnium aluminum nitride ($Hf_{1-x}Al_xN$), zirconium oxynitride ($ZrO_{1-y}N_y$), zirconium silicon nitride ($Zr_{1-z}Si_zN$), zirconium aluminum nitride ($Zr_{1-x}Al_xN$), tantalum oxynitride ($TaO_{1-y}N_y$), tantalum aluminum nitride ($Ta_{1-x}Al_xN$), or tantalum silicon nitride ($Ta_{1-z}Si_zN$). In some embodiments, values of x, y, and z are between about 0.1 and about 1. In one or more embodiments, the doped metal compound is prepared by the ALD technique, and the doping is controlled to modify a bandgap of the channel material. In some embodiments, when the metallic-channel is a doped metal compound, the first thickness is controlled to be less than 30 nm to avoid screen effect and to induce quantum confinement effect in the metallic-channel.

Formation of the gate insulating layer 304 and the gate metal contact 304 are shown in FIG. 3C. In some embodiments, the insulating layer 304 includes one or more layers of silicon oxide, silicon nitride, silicon oxy-nitride, or high-k dielectric materials. High-k dielectric materials comprise metal oxides. Examples of metal oxides used for high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, and/or mixtures thereof. In some embodiments, a thickness of the insulating layer 304 is in the range of about 1 nm to about 5 nm. In some embodiments, the insulating layer 304 includes an interfacial layer made of silicon dioxide. In some embodiments, the insulating layer 304 includes a single layer or a multilayer structure. In some embodiments, insulating layer 304 includes a ferroelectric negative capacitance material.

In one embodiment, the gate metal contact 306 is doped poly-silicon with uniform or non-uniform doping. In some embodiments, the gate metal contact 306 is a metal layer or a metal compound layer. In one or more embodiments, the gate metal contact 306 is a layer of tungsten nitride (WN), tungsten (W), titanium nitride (TiN), titanium (Ti), tantalum nitride (TaN), tantalum (Ta), Platinum (Pt) chromium (Cr), gold (Au), aluminum (Al), copper (Cu), nickel (Ni), other conductive materials with a work function compatible with the substrate material, or combinations thereof. In one or more embodiments, the gate metal contact 306 is formed using a suitable process such as ALD, chemical vapor deposition (CVD), plasma vapor deposition (PVD), plating, or combinations thereof. After formation of blanket layers, the insulating layer 304 and the gate metal contact 306 are patterned and processed for removing of the insulating layer 304 and the gate metal contact 306 from a SD region, resulting in the structure shown in FIG. 3C. In one or more embodiments, the removal of portions of the insulating layer 304 and the gate metal contact 306 from the SD region can be performed, after defining the SD region using patterning (lithography) and cleaning, by using a dry etching method and/or a wet etching method (e.g., using a dilute hydrofluoric (HF) solution). The width of the gate metal contact 306 (in the X direction) is in the range of about 30 nm to about 60 nm in some embodiments.

Next, formation of the FinFET is continued by forming of the SD contacts 308 over the exposed regions of the metallic layer 302, as shown in FIG. 3D, after the removal of the insulating layer 304 and the gate metal contact 306 from the SD region. In some embodiments, the SD contacts 308 are layers of tungsten nitride (WN), tungsten (W), titanium nitride (TiN), titanium (Ti), tantalum nitride (TaN), tantalum (Ta), Platinum (Pt) chromium (Cr), gold (Au), aluminum (Al), copper (Cu), nickel (Ni), other conductive materials with work functions compatible with the substrate material, or combinations thereof. In one or more embodiments, the SD contacts 308 are formed using a suitable process such as ALD, chemical vapor deposition (CVD), plasma vapor deposition (PVD), plating, EBG evaporation, or combinations thereof. In some embodiments, the next step is a high temperature (e.g., about 300° C. to about 900° C.) annealing process to develop Ohmic contacts between the SD metal contacts 308 and the remaining portion of the metallic layer 302. Subsequently, lithography is used to define the SD metal contacts 308 and etching (e.g., wet etch) is performed to remove the unnecessary SD metal from the regions around the defined SD metal contacts 308.

Figure 4A:
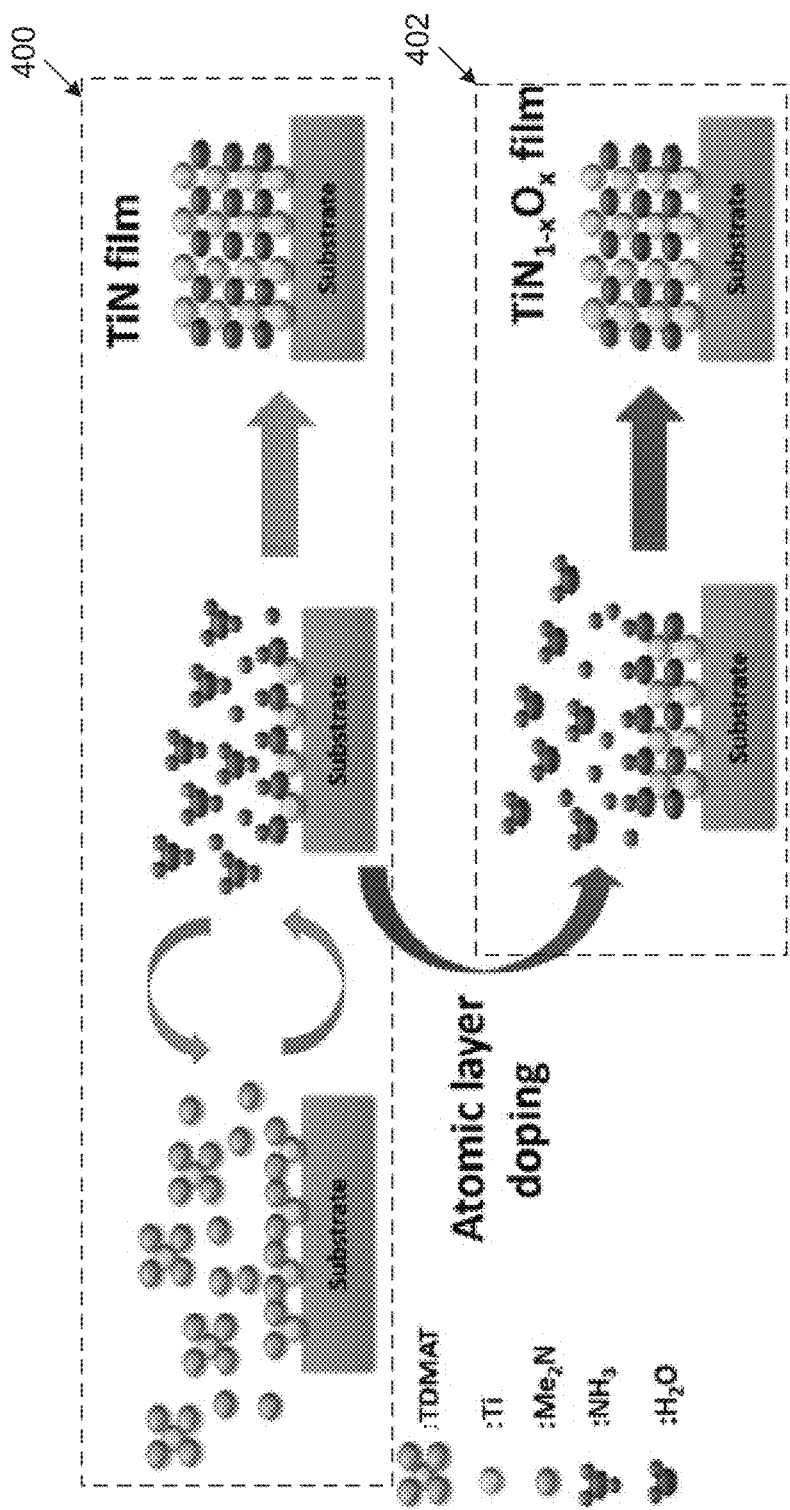
FIGS. 4A through 4G are exemplary diagrams showing various processes for formation of a metallic channel using atomic layer deposition (ALD) technique according to one or more embodiments of the present disclosure.
Figure 4C:
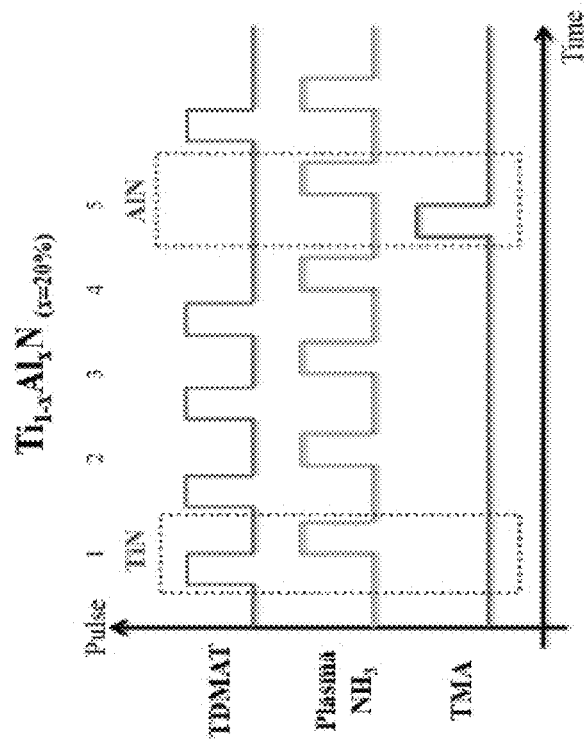
Figure 4B:
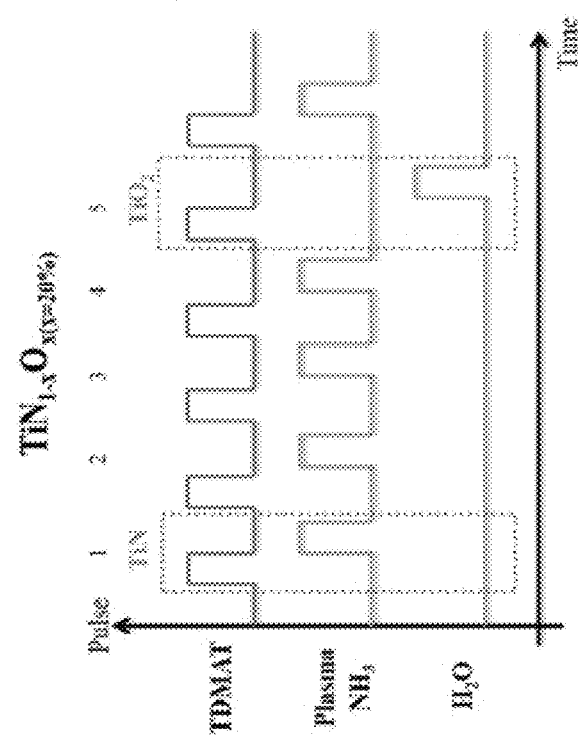
Figure 4D:
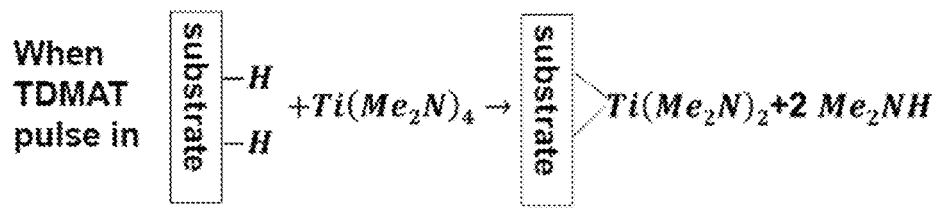
Figure 4E:
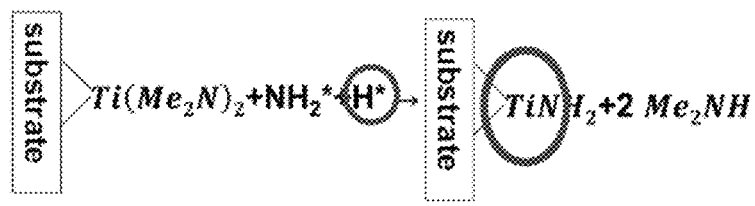
Figure 4F:
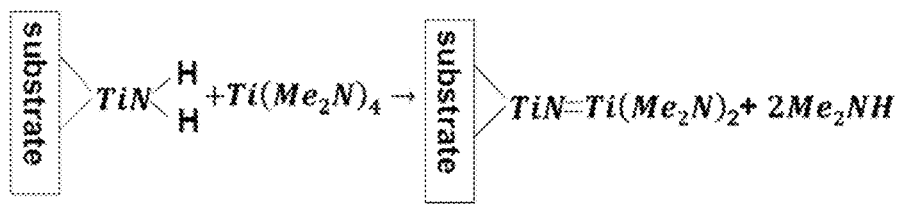
Figure 4G:
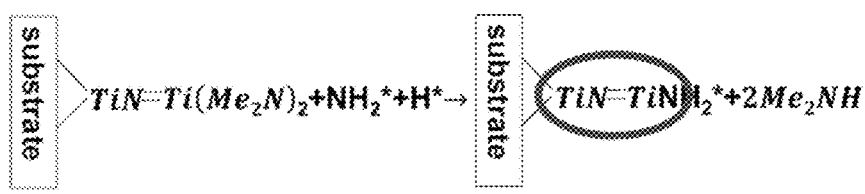

FIGS. 4A through 4G are exemplary diagrams showing various processes of formation of a metallic channel using atomic layer deposition (ALD) technique according to one or more embodiments of the present disclosure. FIG. 4A is conceptual diagram showing, in section 400, formation of thin film of titanium nitrate and, in 402, formation of titanium oxynitride ($TiN_{1-x}O_x$) on the substrate (e.g., 200 of FIG. 2A). In some embodiments, the titanium nitrate film is formed by using tetrakis dimethylamino titanium (TDMAT) and ammonia ($NH_3$) molecules. The TDMAT and $NH_3$ plasma, as shown in FIG. 4B, may be applied to the substrate as sub-cycle (e.g., half-cycle) pulses. A pulse in the context of the current disclosure refers to a pulse of a material that is briefly entered into the ALD process, for example, for a portion of a cycle of the ALD process. A half-cycle pulse, for instance, has a duration of half of an ALD cycle. The first cycle of pulses forms a layer of TiN on the substrate and the application of the same pules in subsequent cycles (e.g., 2 to 4) form four additional layers of TiN. In this process, as shown in FIG. 4D, first 2 molecules of methyl-nitrogen hydride ($Me_2NH$) are formed and then are purged by $N_2$ or Ar gas flow, after that $NH_3$ plasma cleavages into $NH2^*+H^*$ by the inductively coupled plasma (ICP) RF power, as shown in FIG. 4E. Next the two molecule of $Me_2NH$ are purged out by the $N_2$ or Ar gas flow. The formation of the second layer of TiN is shown in FIGS. 4F and 4G, after application of the second TDMAT half-cycle pulse and second $NH_3$ plasma half-cycle pules, respectively.

Similarly, by application of TDMAT and $H_2O$ vapor half-cycle pulses, in the fifth cycle, oxygen doping of the TiN layers is achieved by forming a $TiO_2$ layer. In the exemplary process shown in FIG. 4B, for each five layers of TiN, one layer of $TiO_2$ is formed, which results in a doping level of about 20%. Other doping levels (e.g., 10%, 1% and so on) can be achieved by changing the frequency of pulses of the dopant material. For example, to achieve a 10% or 1% oxygen doping of the TiN layers, for each 10 layers of TiN or each 100 layers of TiN, one layer of $TiO_2$ is formed. In some embodiments, the variation of doping level may be achieved by non-cyclic intervals and by using other dopant materials.

The process of formation of titanium aluminum nitride ($Ti_{1-x}Al_xN$), as shown in FIG. 4C, is similar to the formation of titanium oxynitride (FIG. 4B) and is achieved by applying a number of (e.g., 4 for 20% doping) half-cycle pulses of TDMAT and $NH_3$ plasma and a subsequent half-cycle of NH3 plasma and trimethyl ammonium (TMA) pulses.

In one or more embodiments, the doping level can be varied by changing the number of TDMAT and $NH_3$ half-cycle pulses between TDMAT and $H_2O$ (for FIG. 4B) or $NH_3$ and TMA half cycle pules. In some embodiments, the variation of doping level may be achieved by non-cyclic intervals and by using other dopant materials.

Because of the self-limiting characteristics, the ALD technique provides a number of benefits. For example, film thickness can be controlled precisely and digitally by the number of the applied ALD cycles, with one monolayer precision. Accurate and digital control of the film composition is possible. Deposited film show a desired uniformity. Step coverage and conformality are at a desirable level, and Low defect density can be achieved without pinhole structures.

Figure 5A:
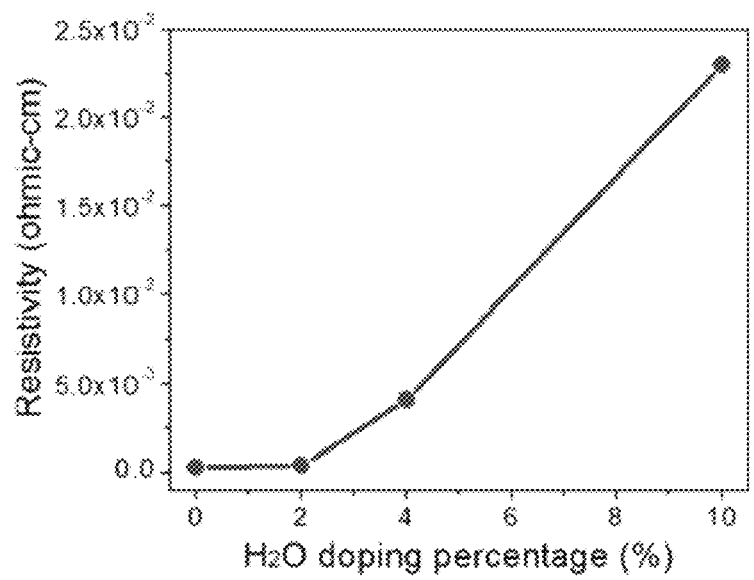
FIGS. 5A-5B are diagrams showing example plots of channel doping and I-V characteristics of a metallic-channel MOSFET device according to one or more embodiments of the present disclosure.
Figure 5B:
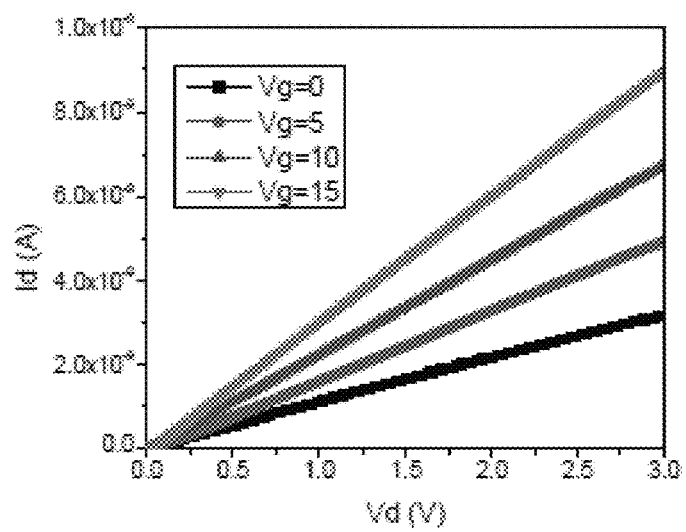

FIGS. 5A-5B are diagrams showing example plots of channel doping and I-V characteristic of a metallic-channel MOSFET device according to one or more embodiments of the present disclosure. FIG. 4A shows a plot of resistivity of the metallic channel material (e.g., 202-1 of FIG. 2D or 302 of FIG. 3B) versus percentage of the $H_2O$ used for oxygen doping (as shown in FIG. 4B). The resistivity of the metallic channel material, as measured by the Hall Effect, is seen to increase with $H_2O$ doping level after a threshold value of about 2% $H_2O$ doping. The increase in resistivity is equivalent to a decrease in electron concentration with the increase of oxygen doping percentage in the $TiN_{1-x}O_x$ ultrathin films.

FIG. 5B shows a plot of I-V characteristic of an exemplary metallic-channel MOSFET device. The I-V characteristic shows variation of the drain current versus drain voltage for different values of voltages (Vg) applied to the gate terminal of the MOSFET device. The metallic-channel of the MOSFET device is TiN with 10% oxygen doping. The I-V characteristic indicates that for TiN with 10% oxygen doping used as the metallic-channel, the MOSFET device can show gate modulation, which is an indication that TiN material with 10% oxygen doping can have a bandgap.

It will be understood that not all advantages have been necessarily discussed herein, no particular advantage is required for all embodiments or examples, and other embodiments or examples may offer different advantages.

In accordance with one aspect of the present disclosure, a method for manufacturing a metallic-channel includes forming a metallic layer on a substrate. The metallic layer is formed by an atomic layer deposition technique and has a first thickness. An insulating layer is formed over the metallic layer. A gate contact layer is formed over the insulating layer. The formed layers are processed to remove the gate contact layer, the insulating layer, and a portion of the metallic layer from a source-drain region. A remaining portion of the metallic layer on the source-drain region has a second thickness that is smaller than the first thickness. Source and drain metal contacts are formed over the remaining portion of the metallic layer In accordance with another aspect of the present disclosure, a method for manufacturing a metallic channel of a semiconductor device includes depositing $TiO_{1-y}N_y$ compound on a substrate using atomic layer deposition technique. A number of layers of titanium nitride (TiN) are formed on the substrate, each layer of the titanium nitride being formed in two pulses, each pulse having one half-cycle duration. The first pulse is a tetrakis dimethylamino titanium (TDMAT) pulse and the second pulse is an ammonia ($NH_3$) plasma pulse. One or more layers of a second compound are formed on the layers of titanium nitride to dope titanium nitride. The second compound includes one of titanium oxide ($TiO_2$) or aluminum nitride (AlN).

In accordance with yet another aspect of the present disclosure, a semiconductor device includes a metal-oxide field-effect transistor (MOSFET) device that includes a metallic layer formed by an atomic layer deposition technique on a substrate. The metallic layer has a first thickness. An insulating layer is formed over the metallic layer. A gate contact layer is formed over the insulating layer, and source and drain metal contacts are formed over a source-drain region, from which the gate contact layer, the insulating layer, and a portion of the metallic layer are removed. A remaining portion of the metallic layer on the source-drain region has a second thickness smaller than the first thickness.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a metallic-channel device, comprising:
    forming a metallic layer on a substrate, the metallic layer being formed by an atomic layer deposition technique and having a first thickness;
    forming an insulating layer over the metallic layer;
    forming a gate contact layer over the insulating layer;
    processing formed layers to remove the gate contact layer, the insulating layer, and a portion of the metallic layer from a source-drain region, a remaining portion of the metallic layer on the source-drain region having a second thickness smaller than the first thickness; and
    forming source and drain metal contacts over the remaining portion of the metallic layer.

2. The method of claim 1, wherein the metallic layer having the first thickness comprises a channel of the metallic-channel device, and wherein the metallic layer comprises one or more metals including titanium nitride (TiN), tungsten nitride (WN), platinum (Pt), hafnium nitride (HfN), zirconium nitride (ZrN), or tantalum nitride (TaN) prepared by the atomic layer deposition technique.

3. The method of claim 2, wherein the first thickness is less than 20 nm.

4. The method of claim 1, wherein the metallic layer having the first thickness comprises a channel of the metallic-channel device, wherein the metallic layer comprises one or more doped metal compounds including $TiO_{1-y}N_y$, $Ti_{1-x}Al_xN$, $Ti_{1-z}Si_zN$, $HfO_{1-y}N_y$, $Hf_{1-z}Si_zN$, $Hf_{1-x}Al_xN$, $ZrO_{1-y}N_y$, $Zr_{1-z}Si_zN$, $Zr_{1-x}Al_xN$, $TaO_{1-y}N_y$, $Ta_{1-x}Al_xN$, or $Ta_{1-z}Si_zN$, and wherein values of x, y, and z are between 0.1 and 1.

5. The method of claim 4, wherein the doped metal compound is prepared by the atomic layer deposition technique, and wherein doping is controlled to modify a bandgap of the channel material.

6. The method of claim 4, wherein the first thickness is less than 30 nm.

7. The method of claim 1, wherein the substrate comprises a material including silicon-on insulator (SOI), germanium-on-insulator (GOI), intrinsic silicon (i-Si), intrinsic germanium (i-Ge), silicon germanium (SiGe), glass, or sapphire.

8. The method of claim 1, wherein forming the insulating layer comprises forming a high-K dielectric or a ferroelectric negative capacitance material.

9. The method of claim 1, wherein forming the source and drain metal contacts comprises forming one or more layers of tungsten nitride (WN), tungsten (W), titanium nitride (TiN), titanium (Ti), tantalum nitride (TaN), tantalum (Ta), Platinum (Pt) chromium (Cr), gold (Au), aluminum (Al), or nickel (Ni).

10. The method of claim 1, wherein the metallic-channel device comprises a field-effect transistor (FET), wherein the FET comprises a metal-oxide FET (MOSFET).

11. The method of claim 1, wherein the substrate includes a fin structure and the metallic-channel device comprises a Fin-FET.

12. A method for manufacturing a metallic channel of a semiconductor device, comprising:
    depositing $TiO_{1-y}N_y$ compound on a substrate using atomic layer deposition technique by:
        forming a plurality of layers of titanium nitride (TiN), a layer of the plurality of layers of titanium nitride being formed in first and second pulses each pulse having a sub-cycle duration, the first pulse being a pulse of tetrakis dimethylamino titanium (TDMAT) and the second pulse being a pulse of ammonia ($NH_3$) plasma; and
    forming one or more layers of a second compound to dope titanium nitride,
    wherein the second compound comprises one of titanium oxide ($TiO_2$) or aluminum nitride (AlN).

13. The method of claim 12, wherein forming the one or more layers of the second compound is to dope titanium nitride with one of oxygen or aluminum atoms.

14. The method of claim 13, further comprising achieving a desired doping level of oxygen or aluminum atoms by controlling a count of the one or more layers of the second compound.

15. The method of claim 13, further comprising achieving a desired doping level of oxygen or aluminum atoms by controlling a count of the plurality of layers of titanium nitride.

16. The method of claim 12, wherein a titanium oxide layer is formed in two sub-cycle pulses, a first sub-cycle pulse being the pulse tetrakis dimethylamino titanium (TDMAT) and a second sub-cycle pulse being a pulse of an oxygen source, wherein the oxygen source comprises water ($H_2O$) vapor.

17. The method of claim 12, wherein an aluminum nitride layer is formed in two sub-cycle pulses, a first sub-cycle pulse being a pulse of trimethyl ammonium (TMA) and a second sub-cycle pulse being a pulse of $NH_3$ plasma.

18. A method for manufacturing a metallic channel device, comprising:
    depositing a metallic layer on a substrate, wherein the metallic layer is selected from the group consisting of $TiO_{1-y}N_y$, $Ti_{1-x}Al_xN$, $Ti_{1-z}Si_zN$, $HfO_{1-y}N_y$, $Hf_{1-z}Si_zN$, $Hf_{1-x}Al_xN$, $ZrO_{1-y}N_y$, $Zr_{1-z}Si_zN$, $Zr_{1-x}Al_xN$, $TaO_{1-y}N_y$, $Ta_{1-x}Al_xN$, or $Ta_{1-z}Si_zN$, and wherein values of x, y, and z are between 0.1 and 1;
    depositing an insulating layer comprising a high-k dielectric or a ferroelectric negative capacitance material over the metallic layer;
    depositing a gate contact layer formed over the insulating layer and a portion of the metallic layer having a first thickness, wherein the gate contact layer is selected from the group consisting of W, WN, Ti, TiN, Ta, TaN, Pt, Cr, Au, Al, Cu, and Ni; and
    depositing source and drain metal contacts over a second portion of the metallic layer having a second thickness, wherein the source and drain metal contacts are selected from the group consisting of W, WN, Ti, TiN, Ta, TaN, Pt, Cr, Au, Al, Cu, and Ni,
    wherein the source and drain metal contacts are spaced apart from the gate contact layer, and
    wherein the second thickness is smaller than the first thickness.

19. The method of claim 18, wherein the first thickness is less than 30 nm.

20. The method of claim 18, further comprising annealing the device at a temperature of about 300° C. to about 900° C. after depositing the source and drain metal contacts.

* * * * *